United States Patent
Caesar

(10) Patent No.: US 11,159,883 B2
(45) Date of Patent: Oct. 26, 2021

(54) METHOD FOR ADJUSTING LISTENER LOCATION AND HEAD ORIENTATION WITHIN A PHYSICAL OR VIRTUAL SPACE

(71) Applicant: Marvin William Caesar, Sherman Oaks, CA (US)

(72) Inventor: Marvin William Caesar, Sherman Oaks, CA (US)

( * ) Notice: Subject to any disclaimer, the term of this patent is extended or adjusted under 35 U.S.C. 154(b) by 0 days.

(21) Appl. No.: 16/432,182

(22) Filed: Jun. 5, 2019

(65) Prior Publication Data

US 2019/0289394 A1    Sep. 19, 2019

Related U.S. Application Data

(63) Continuation of application No. 15/838,333, filed on Dec. 11, 2017, now abandoned.

(51) Int. Cl.
| | |
|---|---|
| *H04R 27/00* | (2006.01) |
| *H04R 3/12* | (2006.01) |
| *H03G 5/16* | (2006.01) |
| *H04H 60/04* | (2008.01) |
| *H04S 7/00* | (2006.01) |
| *H03G 3/30* | (2006.01) |

(52) U.S. Cl.
CPC ............... *H04R 3/12* (2013.01); *H04R 27/00* (2013.01); *H03G 3/3005* (2013.01); *H03G 5/165* (2013.01); *H04H 60/04* (2013.01); *H04R 2227/007* (2013.01); *H04S 7/304* (2013.01); *H04S 2400/11* (2013.01); *H04S 2420/01* (2013.01)

(58) Field of Classification Search
CPC .... H04R 3/12; H04R 27/00; H04R 2227/007; H04H 60/04; H03G 5/165; H03G 3/3005; H04S 7/304; H04S 2400/11; H04S 2420/01
See application file for complete search history.

(56) References Cited

U.S. PATENT DOCUMENTS

| | | | |
|---|---|---|---|
| 10,003,901 B1 * | 6/2018 | Slick ....................... | H04S 3/002 |
| 10,531,216 B2 * | 1/2020 | Mor ......................... | H04S 7/307 |
| 2005/0130717 A1 * | 6/2005 | Gosieski, Jr. ...... | H04L 29/06027 |
| | | | 455/575.2 |
| 2010/0045462 A1 * | 2/2010 | Gibson ................ | H04R 29/007 |
| | | | 340/572.1 |
| 2013/0010984 A1 * | 1/2013 | Hejnicki ................ | H04R 27/00 |
| | | | 381/107 |
| 2015/0063553 A1 * | 3/2015 | Gleim ................... | H04M 3/568 |
| | | | 379/202.01 |
| 2017/0257724 A1 * | 9/2017 | Bosnjak ................. | H04R 5/033 |
| 2017/0359646 A1 * | 12/2017 | Scharrer .............. | H04R 1/1033 |
| 2018/0150275 A1 * | 5/2018 | Mate ....................... | G06F 3/165 |

* cited by examiner

*Primary Examiner* — Joseph Saunders, Jr.
(74) *Attorney, Agent, or Firm* — Lewis Anten

(57) ABSTRACT

The present invention is a system that detects the location and head orientation of a live performer on stage in front of an audience and adjusts the individual elements of the mix either by changing them at the listener's position or by feeding the location and orientation information back to the monitor mixer or a combination of both. The adjustments would include left/right panning, relative levels, equalization, transient response, reverberation levels, panning, and time delay, as well as other possible modifications to the signal so that the performer senses that he/she is actually listening to the various instruments, vocals, acoustic space and audience, in their real or virtual locations.

12 Claims, 5 Drawing Sheets

METHOD FOR ADJUSTING LISTENER LOCATION AND HEAD ORIENTATION WITHIN A PHYSICAL OR VIRTUAL SPACE

BACKGROUND

Many performers on stage use "in ear monitors" (IEMs) rather than monitor speakers. There are a number of advantages for the use of IEMs. One advantage is that the IEMs allow the performers to move around the stage and still hear their own monitor mix. Another advantage is that without speakers on stage, the chance of feedback loops forming between the monitor speakers and the microphones is eliminated. Another advantage is that without the high levels from monitor speakers leaking into open microphones on stage, the front of house mix is cleaner.

A common complaint about IEMs is that because the performer is presented with the same mix regardless of the location of the performer on stage or the orientation of the performer's head relative to other performers on stage and the audience in front, the performer feels "separated" or "isolated" from the live performance, diminishing the realism and immediacy that performers rely upon. Also, the sonic image is all inside the listener's head. This adds to the performer's cognitive load, speeding the onset, and increasing the amount, of listener fatigue. Listener fatigue is a temporary threshold shift (lower level signals are not heard) and a spreading of the critical bands (hearing in noise is diminished) The typical response to listener fatigue is to increase the sound level, thus increasing the fatigue and its ill effects. A vocalist or a musician relies on his/her ability to hear in order to perform. As that ability is diminished the performance suffers.

One effort to mitigate this problem has been to add ambience microphones to the mix. But that "ambience" is still the same regardless of where the performer is on stage and which way the performer is facing. Another effort has been to vent the in-ear ear piece itself so that there is reduced isolation. This gives a greater sense of ambience but at the possible cost of clarity of the actual output of the in-ear monitor as well as possible phase cancellation between the ambient and electronic signals in the monitor. In addition, there may be instruments that have no acoustic output on stage (e.g.—electronic keyboards, electronic drums) and therefore would not be part of the ambience mix. These solutions would not give the performer any accurate sense of location on stage or proximity to other performers.

There are locating systems that track a performer's location on stage but use that information to adjust the panning of that performer's signal only for the front of house mix in the PA system, not for the monitor system.

Real-time locating systems (RTLS) are used to automatically identify and track the location of objects or people in real time, usually within a building or other contained area. Wireless RTLS tags are attached to objects or worn by people, and in most RTLS, fixed reference points receive wireless signals from tags to determine their location. Examples of real-time locating systems include tracking automobiles through an assembly line, locating pallets of merchandise in a warehouse, or finding medical equipment in a hospital. The physical layer of RTLS technology is usually some form of radio frequency (RF) communication, but some systems use optical (usually infrared) or acoustic (usually ultrasound) technology instead of or in addition to RF. Tags and fixed reference points can be transmitters, receivers, or both, resulting in numerous possible technology combinations. RTLS are a form of local positioning system, and do not usually refer to GPS or to mobile phone tracking. Location information usually does not include speed, direction, or spatial orientation.

A number of disparate system designs are all referred to as "real-time locating systems", but there are two primary system design elements:

ID signals from a tag are received by a multiplicity of readers in a sensory network, and a position is estimated using one or more locating algorithms, such as trilateration, multilateration, or triangulation. Equivalently, ID signals from several RTLS reference points can be received by a tag, and relayed back to a location processor. Localization with multiple reference points requires that distances between reference points in the sensory network be known in order to precisely locate a tag, and the determination of distances is called ranging. Another way to calculate relative location is if mobile tags communicate directly with each other, then relay this information to a location processor.

RF trilateration uses estimated ranges from multiple receivers to estimate the location of a tag. RF triangulation uses the angles at which the RF signals arrive at multiple receivers to estimate the location of a tag. Many obstructions, such as walls or furniture, can distort the estimated range and angle readings leading to varied qualities of location estimate. Estimation-based locating is often measured in accuracy for a given distance, such as 90% accurate for 10 meter range. Systems that use locating technologies that do not go through walls, such as infrared or ultrasound, tend to be more accurate in an indoor environment because only tags and receivers that have line of sight (or near line of sight) can communicate.

There is a wide variety of systems concepts and designs to provide real-time locating.
  Active radio frequency identification (Active RFID)
  Active radio frequency identification-infrared hybrid (Active RFID-IR)
  Infrared (IR)
  Optical locating
  Low-frequency signpost identification
  Semi-active radio frequency identification (semi-active RFID)
  Passive RFID RTLS locating via Steerable Phased Array Antennae
  Radio beacon
  Ultrasound Identification (US-ID)
  Ultrasonic ranging (US-RTLS)
  Ultra-wideband (UWB)
  Wide-over-narrow band
  Wireless Local Area Network (WLAN, Wi-Fi)
  Bluetooth
  Clustering in noisy ambience,
  Bivalent systems
  Depending on the physical technology used, at least one and often some combination of ranging and/or angulating methods are used to determine location:
  Angle of arrival (AoA)
  Line-of-sight (LoS)
  Time of arrival (ToA)
  Multilateration (Time difference of arrival) (TDoA)
  Time-of-flight (ToF)
  Two-way ranging (TWR)
  Symmetrical Double Sided-Two-Way Ranging (SDS-TWR)
  Near-field electromagnetic ranging (NFER)

There are commercial products that use various means to detect head orientation such as Waves NX or Klang, but they do not use any means to detect location, diminishing their usefulness in any application where the listener and/or the signal sources are moving.

Other systems have used tracking devices worn by the performers for localizing the performers on the stage. See https://ubisense.net/en/news-events/news/ubisense-and-outboard-deliver-vocal-localisation-solutions-tokyos-new-national-theatre-and-finlands-national-opera However, this system does not assist the performers themselves and does not track the orientation of the heads of the performers.

OBJECTS OF THE PRESENT INVENTION

It is an object of the present invention is to better correlate the sonic image with the performer's visual image;

It is another object of the present invention to reduce listener fatigue;

It is another object of the present invention to vary the mix based on the location of the performer;

It is another object of the present invention to vary the mix based on the head orientation of the performer;

It is another object of the present invention to have the sonic image in front of the performer;

It is another object of the present invention to improve virtual reality systems.

These and other objects will be evident from the review the following specification and drawings.

SUMMARY OF THE INVENTION

The preferred embodiment of the invention is a system that detects the location and head orientation of a live performer on stage in front of an audience and adjusts the individual elements of the mix either by changing them at the listener's position or by feeding the location and orientation information back to the monitor mixer or a combination of both. The adjustments would include left/right, front/back and up/down panning; relative levels; equalization; transient response; reverberation levels, direction, time delay; as well as other possible modifications to the signal so that the performer senses that he/she is actually listening to the various instruments, vocals, acoustic space and audience, in their real or virtual locations.

The location detection system has a detection system on or near the stage. Each performer would wear one or more remotely readable devices (such as a RFID tag) with unique digital identities. The detectors could use relative signal strength, time delay difference, triangulation, zoning algorithms or other methods or combination to locate the performer in the performance area.

Orientation information would be generated by a means such as a magnetometer or gyroscope to detect the performer's head relative to known horizontal and vertical orientation. The detection device could be placed on or near one of the ear pieces in order to follow the performer's head movements. That information would be sent to a belt pack receiver and make adjustments in the pack or be sent back to the monitor mixing desk for it to make adjustments or a combination of both.

A "reference" mix would be created based on where the performer would most often be standing and facing the audience. As the performer moved around the stage the components of the mix would be modified by level, delay, equalization, transient response, reverberation, etc. For example, as the performer moved closer to an instrument, that instrument would be increased in level, have less delay time, have greater high frequency equalization, and greater transient response. As the performer moved away from the instrument the level of the instrument would be reduced, the delay time increased, and has less high frequency equalization and transient response. The ratio of direct signal to reverberation as well as the timing of the reflections could also be modified based on the proximity of the performer to an instrument.

As the performer turned his/her head, that is, changed orientation, the stereo mix would be modified. For example, as the performer turns his/her head from facing the audience to the right, the stereo image would shift so that the audience was more in the left ear and the instruments were more in the right ear. The mix could also be modified to account for head related transfer function (HRTF). In addition to modifying the stereo mix to indicate right and left, it is also envisioned that the orientations of up and down and back in front would also be modified, providing the performer with a complete orientation of the sound in space.

The apparatus that receives the location and orientation information would be capable of making all the adjustments within preset limits and also be able to revert to a reference mix if the location or the orientation system fails.

The sonic image when listening to headphones is almost always inside the listener's head. There are techniques which bring the image out of the listener's head, but only to side to side and behind the head, not in front. One of the aims of the invention is to better correlate the sonic image with the performer's visual image.

Each individual has "learned" to locate a sonic image based on his/her own unique combination of pinna shape and head size, necessitating customized measurement for each individual. One method for making individualized headsets is to use miniature microphones in each ear and measure the response for different input locations (Smyth Research). Another method would be to have a general setting and through successive approximation adjust the setting so that the individual correlates the sonic image to a real or virtual visual image.

Other applications for this technology include, but are not limited to, education and training systems, virtual and augmented reality displays, games, museums, and amusement park rides.

DETAILED DESCRIPTION OF THE DRAWINGS

Figure 1:
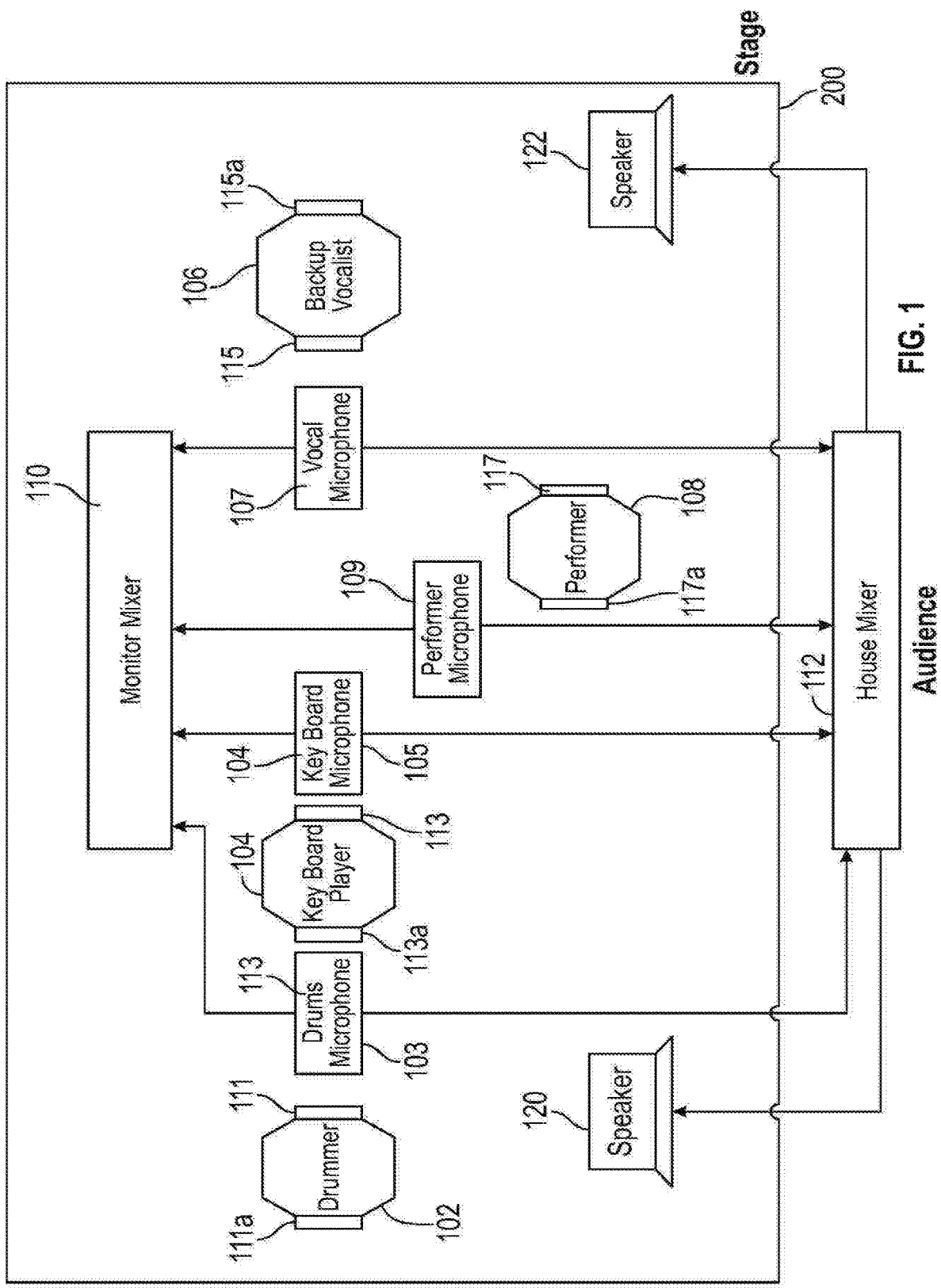
FIG. 1 is a view of the prior art stage and mixers.

FIG. 1 shows the prior art use of the monitor and house mixers and their relationship to the performers and the audience.

On the stage 200 are located the performers 102-108, including, for example only, the drummer 102, keyboard player 104, backup vocalists 106 and the main performer 108. Each of the above performers has associated microphones 103, 105, 107 and 109 to pick up the performers' voices and/or instruments. Wired microphone signals are split through a transformer not shown and wireless microphone signals are split after the receiver. One leg of the split is sent to the monitor mixer 110 and one signal is sent to the house mixer 112. The monitor mixer 110 is typically located on the side of the stage and is operated by a console monitor mixer person, not shown. The monitor mixer 110 receives an input from each of the performers and/or the performers' instruments and the person operating the monitor mixer 110 can control the volume and tone of each of the inputs from the performers, as well as otherwise alter the input signal. For example, the monitor mixing person can increase the sound of the drums or the keyboard or the vocal, or change the tone for one, or any combination of each of them. The monitor mixer 110 sends its outputs to the headphones 111, 113, 115, and 117 worn by each of the performers 102, 104, 106 and 108 and/or to the speaker 111a, 113a, 115a, and 117a associated with each performer 102-108 either by hard wire or by wireless connection. The outputs from the monitor mixer 110 are thus heard by each of the performers.

The monitor engineer will create an individual mix for each performer based on that performer's preferences. Each mix is then sent to either the monitor speakers located near each performer, or via RF to headphones worn by each performer. There are performers who are in a fixed position, such as a drummer, who may use just speakers. Performers will move around the stage would use just the wireless earphones. Some performers demand to have both.

The house mixer 112 also receives the output signal from each of the performers' microphones 103-109. The house mixer 112 is typically located towards the rear of the audience, not on the stage. The output of the house mixer 112 is amplified and sent to the speakers 120 and 122 that the audience hears. The number and location of the speakers 120 and 122 are selected for optimizing the volume and quality of what is heard by the audience. The performers 102, 104, 106 and 108 do not hear very much of the output of the house speakers. The operator of the house mixer 112 modifies the output of the house mixer to maximize the aesthetic sound heard by the audience. For example, the house mixer may increase the volume of the performer while reducing the volume of the vocal background 106. The house mixer can also increase the overall volume and balance of the house speakers.

Figure 2:
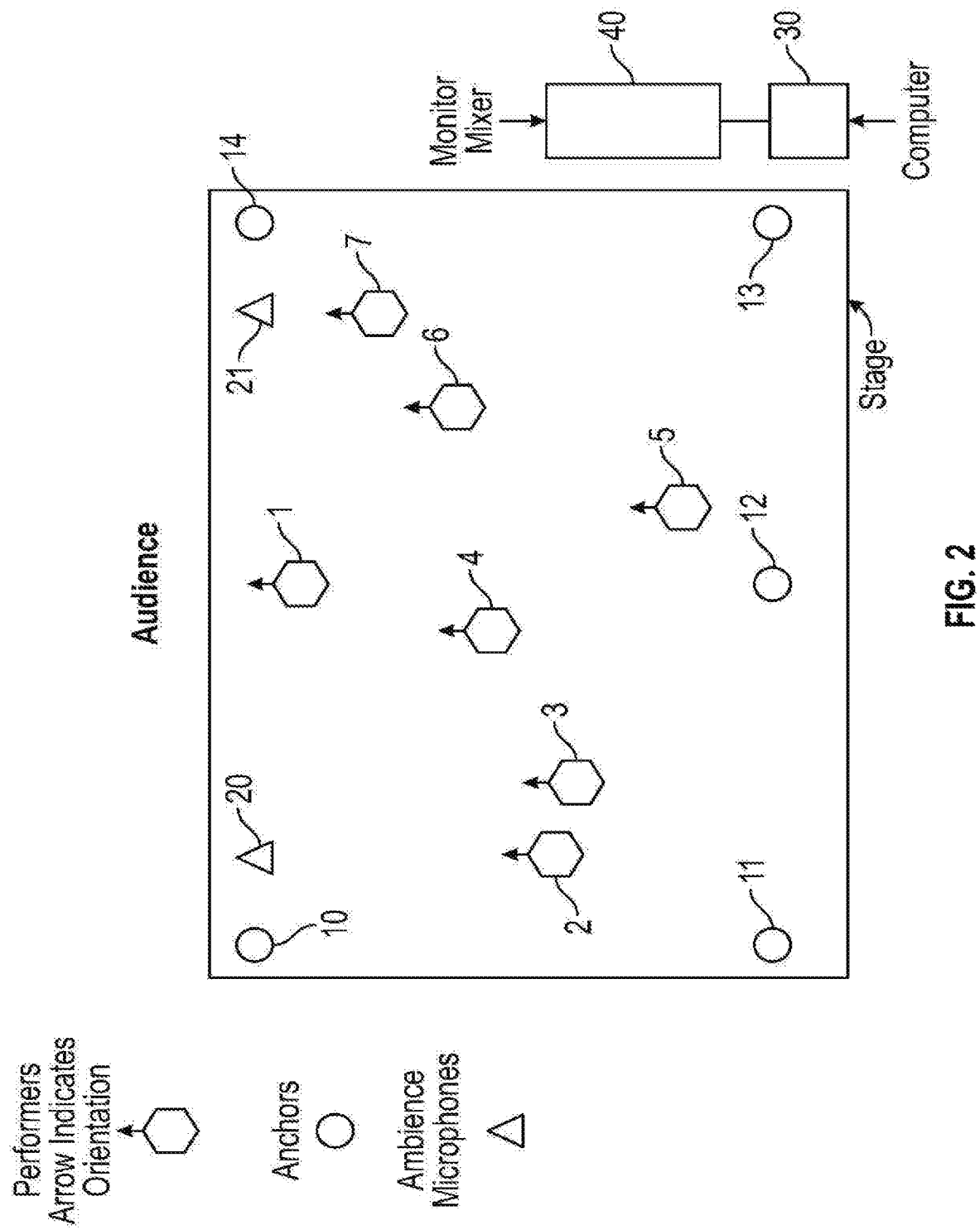
FIG. 2 is a view of the stage showing the performers and their orientation facing the audience.

Referring to FIG. 2 the localization system of the present invention is shown. Performers 1 through 7 are all equipped with active radio frequency identification tags and stereo in-ear monitors and/or associated speakers (not shown). Anchors 10 through 14 receive signals from the tags. Anchors send the received signals to the computer 30 which analyzes the relative time delay between the signals and locates each of the tags on the stage. Fixed locations such as ambience microphones 20, 21 are set in the computer.

Computer 30 sends localization information to the monitor mixer 40. The monitor mix for each performer is automatically adjusted based on the localization information.

Figure 3:
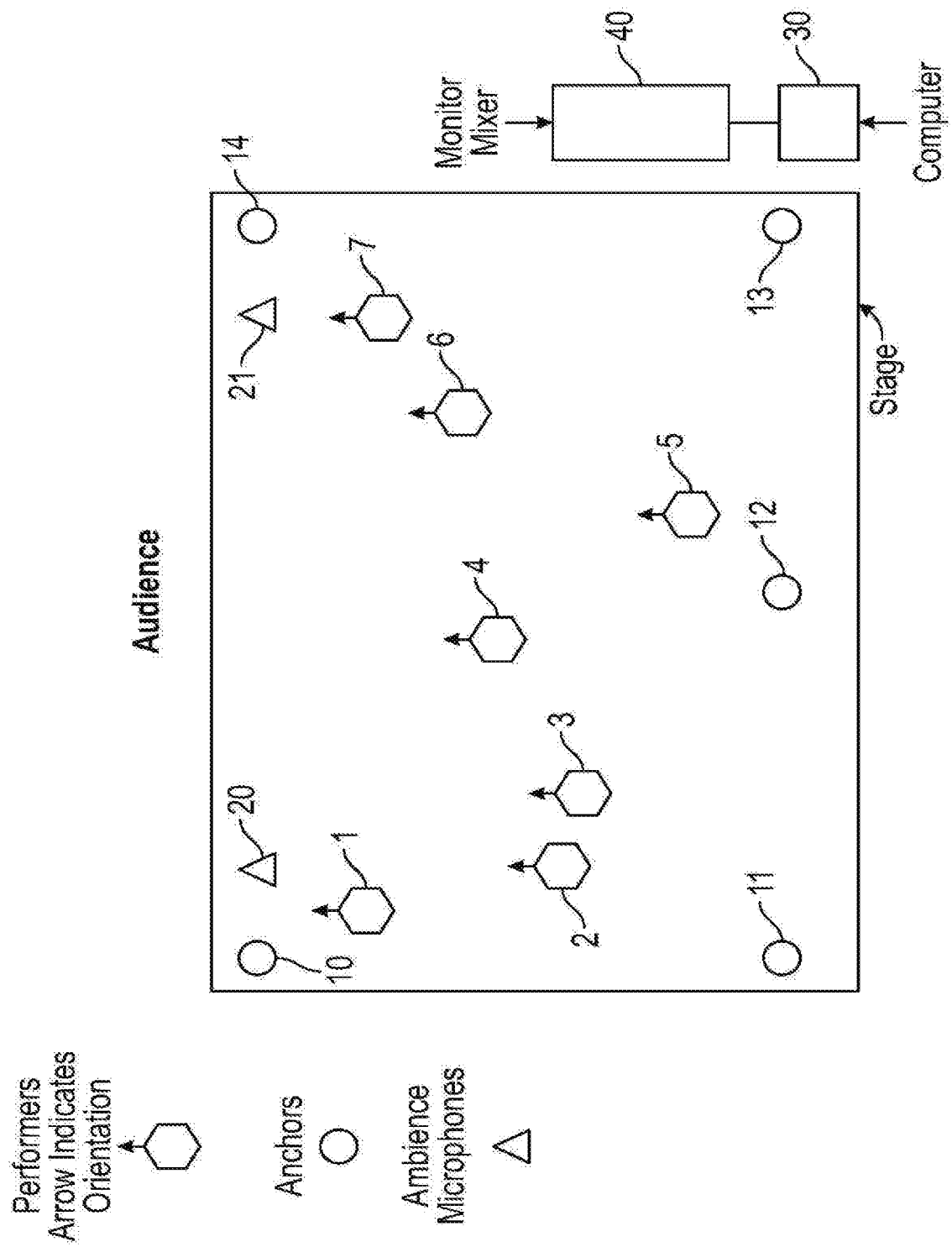
FIG. 3 is a view of the stage showing the performers with performer 1 moving to stage left and facing the audience.

Referring to FIG. 3, the localization system of the present invention is shown where Performer 1 moves to stage left. As Performer 1 moves, the localization system sends the signals to the computer 30 which computes the new relative locations between each performer and fixed locations.

The computer 30 sends the localization information to the monitor mixer 40. The monitor mixer 40 adjusts the mix for each performer as follows:

In comparison to FIG. 2, the panning of the audio signal from Performer 1 would shift to the left in the monitor mixes for Performers 2 through 7. The level of the audio signal from Performer 1 would increase in the monitor mixes for Performers 2 and 3, decrease for Performers 4,5,6 and 7. The delay time for the audio signal from Performer 1 would decrease for Performers 2 and 3, and increase for Performers 4,5,6, and 7. These adjustments in combination with other adjustments (reverberation, equalization, head related transfer function, etc.) would be made in the monitor mixes for Performers 2 through 7 so that their aural perception of where Performer 1 is at any particular moment will match their visual perceptions.

The panning of the audio signals from Performers 2 through 7 and from Ambience Microphones 20 and 21 would shift to the right in the monitor mix for Performer 1. The audio signals from Performers 2 and 3 and from Ambience Microphone 20 would increase and the audio signals from Performers 4,5,6 and 7 and Ambience Microphone 21 would decrease in the monitor mix for Performer 1. The delay times of the audio signals from Performers 2 and 3 and ambience microphone 20 would decrease and the delay times of the audio signals from Performers 4, 5, 6 and 7 and Ambience Microphone 21 would increase. These adjustments along with other adjustments (reverberation, equalization, head related transfer function, etc.) would be made in the monitor mix for Performer 1 so that performer's aural perception of where Performers 2 through 7 are at any particular moment will match his/her visual perception.

Figure 4:
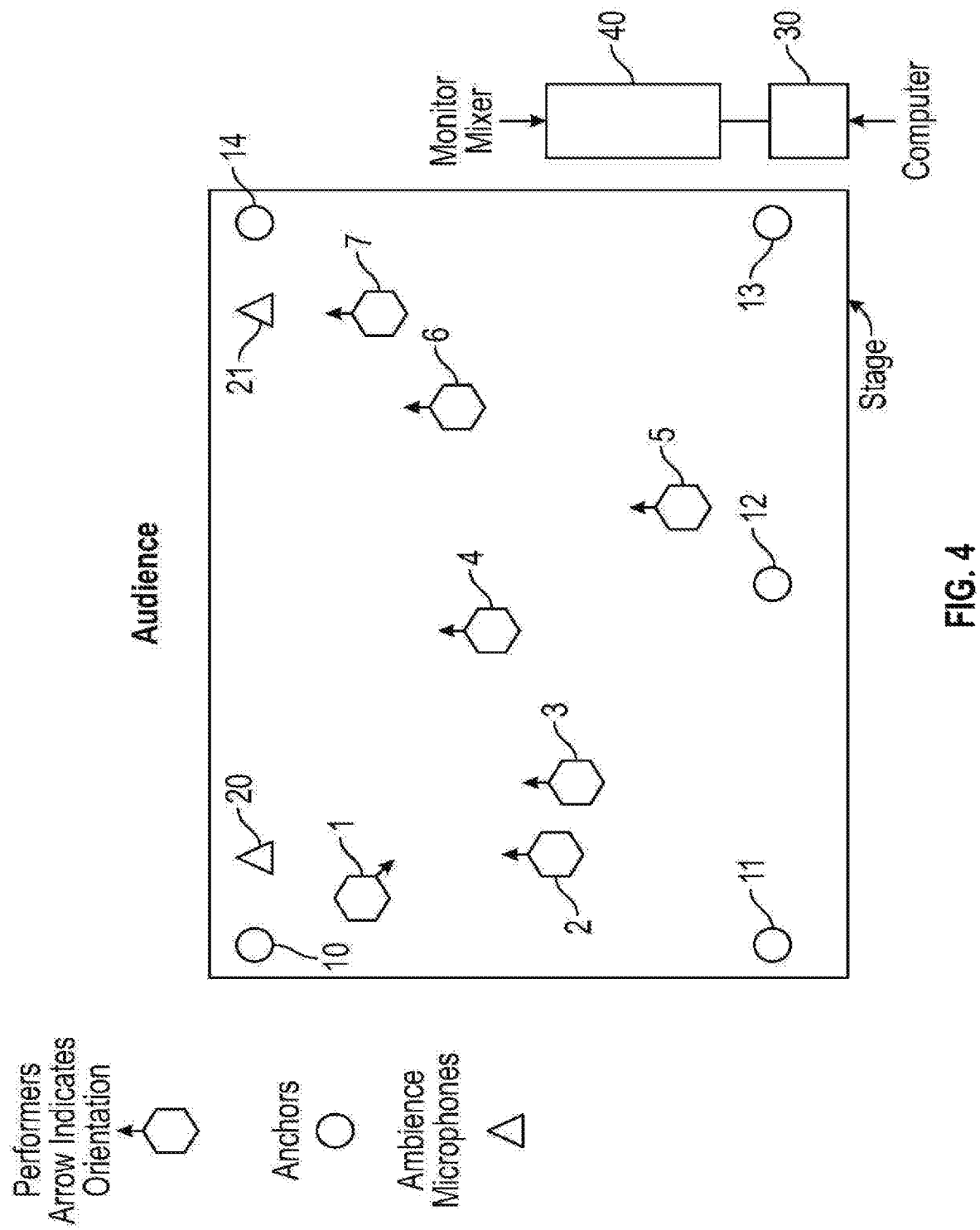
FIG. 4 is a view of the stage showing performers and their orientation with performer 1 at the stage left, facing the back right of the stage.

Referring to FIG. 4, the head orientation system of the present invention is shown as Performer 1 turns his/her head to the right. An electronic compass located in or near one of the two in-ear monitors detects the change of orientation. The orientation information is sent from Performer 1 to the computer 30 through a Bluetooth connection. The computer sends the information to the monitor mixer. The monitor mixer automatically adjusts monitor mix for Performer 1 as follows:

The panning of the audio signals from Ambience Microphones 20 and 21 and Performers 6 and 7 would shift to the left. Audio signals from Performers 4 and 5 would be centered. Audio signals from Performers 2 and 3 would shift to the right. Head related transfer function adjustments would be applied on audio signals based on the new orientation of Performer 1. These adjustments will aid in making Performer 1's aural perception match his/her visual perception.

Figure 5:
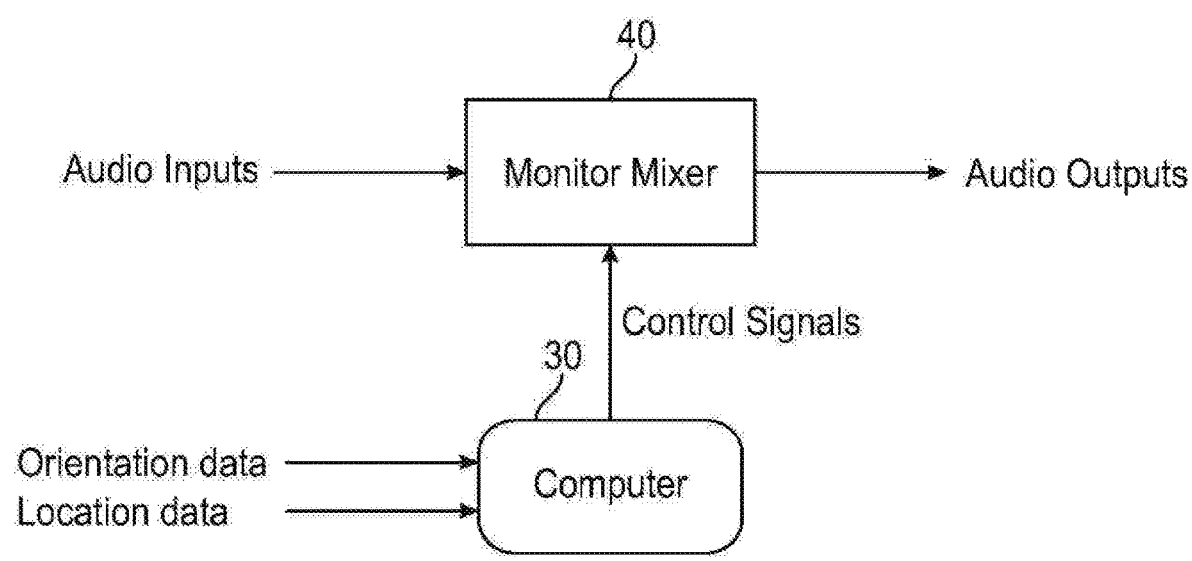
FIG. 5 is a block diagram of the Monitor Mixer and computer controlling the input for the performers' microphones and the output to the various performers' headphones and/or speakers.

Referring to FIG. 5 Monitor Mixer 40, the Monitor Mixer 40 has the standard audio inputs and outputs. In the event that the location and/or the orientation systems fail, the audio mixes would still be sent to the performers. In addition to the standard features found on monitor mixers, the Monitor Mixer 40 would have the added features of adjusting time delay, stereo balance, equalization, reverberation and transient response for every input to each mix. The Monitor Mixer 40 would also have the feature of adjusting HRTF, and stereo balance on each output.

The Anchors 10-14 send their data to the Computer 30 which analyzes the data to determine the location of each performer. The Computer 30 sends control signals to the Monitor Mixer 40 which is equipped to receive these signals. The Monitor Mixer 40 makes the appropriate audio adjustments to conform the audio image to the location of the audio source relative to the location of the audio output.

The orientation data generated by the compass in the performers' in-ear monitors are sent to the Computer 30. The Computer 30 generates control signals and sends them to the Monitor Mixer 40. The Monitor Mixer 40 makes the appropriate adjustments to the individual audio outputs to conform to the head orientation of each performer.

What is claimed:

1. A method of providing a monitor mix from a sound mixer to at least one live performer wearing headphones and moving and said live moving performer having an output signal associated with said moving performer, the inputs to the sound mixer being from a plurality of sources including the output signal from the live performer, the location of at least some of said sources capable of being electronically determined, comprising the steps of: adjusting at least some of the inputs associated with said sources within the sound mixer based on the relative location of at least some of those sources to each other and transmitting the output from the sound mixer to the headphones of said live performer.

2. The method of claim 1 in which the sound mix sent to the performer is dependent on the orientation of the performer's head.

3. The method of claim 1 in which the headphones are in ear monitors (IEMs).

4. A method of providing a sound mix from a sound mixer to at least one live performer who is moving, the input of the sound monitor mixer being the elements of a plurality of inputs and the moving performer generating an output signal associated with the moving performer, and having a location identification tag and an in ear monitor (IEM), comprising the steps of:

providing the sound monitor mixer with each of the inputs, including the output from the output signal associated with the live performer moving and the output from at least one location identification tag for at least one performer moving so as to locate the performer as said performer moves; and electronically configuring the sound monitor mixer to detect changes in the inputs to the sound monitor mixer dependent on the location of each input, and the sound monitor mixer configured to generate an output to the in ear monitor (IEM) of at least said moving performer, said output being each separate element of the mix dependent on the location of each performer.

5. The method of claim 4 in which the sound mix sent to the moving performer is dependent on the orientation of the moving performer's head.

6. A sound monitor mixer for transmitting a sound mix to at least one live performer who is moving wearing a location identification tag and an in ear monitor (IEM), the sound monitor mixer configured to modify a plurality of elements dependent on the location of said at least one moving performer said moving performer having an output signal associated with said moving performer, said output signal being sent to the mixer, the output of said monitor mixer being sent to said in ear monitor (IEM) worn by said at least one live moving performer.

7. The sound mixer of claim 6 in which the output of the sound mix is dependent on the orientation of each performer's head.

8. A method of providing a monitor mix from a sound mixer to at least one moving live person wearing headphones and having an output signal associated with said live moving person, the inputs to the sound mixer being a plurality of sources, including the output signal associated with said live moving person, the location of at least some of said sources capable of being determined, comprising the steps of: electronically adjusting at least some of the inputs associated with said sources within the sound mixer based on the relative location of at least some of those sources to each other and transmitting the output from the sound mixer to the headphones of said live moving person.

9. The method of claim 8 in which at least one of the sources is associated with a virtual image.

10. The method of claim 8 in which the sound mix sent to the live person is dependent on the orientation of the live person's head.

11. A method of providing a monitor mix from a sound mixer to at least one live moving person wearing headphones for use with virtual reality inputs, an output signal associated with said live moving person, the inputs to the sound mixer being a plurality of sources including the output signal associated with the live moving person, comprising the steps of: adjusting at least some of the inputs associated with said sources within the sound mixer based on the relative location of at least some of those sources to each other and transmitting the output from the sound mixer to the headphones of said live moving person.

12. The method of claim 11 in which the sound mix sent to the live moving person is dependent on the orientation of the live moving person's head.

* * * * *